(12) United States Patent
Worry et al.

(10) Patent No.: US 11,821,958 B2
(45) Date of Patent: Nov. 21, 2023

(54) SYSTEMS, METHODS, AND DEVICES FOR STATE-OF-HEALTH ESTIMATION IN ENERGY STORAGE SYSTEMS

(71) Applicant: Nuvation Research Corporation, Sunnyvale, CA (US)

(72) Inventors: Michael Worry, Campbell, CA (US); Stefan Janhunen, Waterloo (CA); Manoj Mathew, Kitchener (CA)

(73) Assignee: NUVATION RESEARCH CORPORATION, Sunnyvale, CA (US)

( * ) Notice: Subject to any disclaimer, the term of this patent is extended or adjusted under 35 U.S.C. 154(b) by 0 days.

(21) Appl. No.: 17/584,750

(22) Filed: Jan. 26, 2022

(65) Prior Publication Data

US 2023/0236258 A1    Jul. 27, 2023

(51) Int. Cl.
*G01R 31/392*   (2019.01)
*H02J 7/00*   (2006.01)
*G01R 31/396*   (2019.01)
*G01R 31/374*   (2019.01)
*G01R 31/3842*   (2019.01)

(52) U.S. Cl.
CPC ......... *G01R 31/392* (2019.01); *G01R 31/374* (2019.01); *G01R 31/3842* (2019.01); *G01R 31/396* (2019.01); *H02J 7/005* (2020.01)

(58) Field of Classification Search
None
See application file for complete search history.

(56) References Cited

U.S. PATENT DOCUMENTS

| 2015/0070024 | A1* | 3/2015 | Kim ...................... | G01R 31/392 |
| | | | | 324/430 |
| 2017/0012326 | A1 | 1/2017 | Schaffner et al. | |
| 2017/0205468 | A1* | 7/2017 | Park ...................... | G01R 31/374 |
| 2017/0331162 | A1 | 11/2017 | Clarke et al. | |
| 2019/0176639 | A1* | 6/2019 | Kumar .................. | B60L 3/0046 |
| 2021/0011089 | A1 | 1/2021 | Choi et al. | |

OTHER PUBLICATIONS

International Search Report and Written Opinion dated Jul. 5, 2023 in PCT Application No. PCT/US2023/011523.

* cited by examiner

*Primary Examiner* — Jas A Sanghera
(74) *Attorney, Agent, or Firm* — Snell & Wilmer L.L.P.

(57) ABSTRACT

Systems, methods, and devices are provided for estimating a state-of-health (SOH) in an energy storage system, where the estimate accounts for both power fade and capacity fade. The SOH estimation system comprises a SOH estimation module configured to receive, and to determine the estimate of the SOH based on: a nominal capacity input; a voltage input; a current input; a nominal open circuit voltage curve; an operational resistance model; a nominal resistance model; an operational dynamic model; and a rated discharge current. The SOH estimation module may further comprise a SOH aggregation module configured to receive a power rating estimate, $PR_n$, and a normalized capacity estimate, $NC_n$, and may be configured to determine the estimate of the SOH based on the power rating estimate, $PR_n$, and the normalized capacity estimate, $NC_n$.

12 Claims, 10 Drawing Sheets

Stack of Cells

Stack of Modules

SYSTEMS, METHODS, AND DEVICES FOR STATE-OF-HEALTH ESTIMATION IN ENERGY STORAGE SYSTEMS

FIELD OF INVENTION

The present disclosure relates generally to energy storage system charging and discharging and, in particular, to state-of-health estimation in energy storage systems ("ESS") and energy storage devices.

BACKGROUND

The ability of an energy storage device to store charge and generate power decreases over time and use. The state-of-health ("SOH") of an energy storage device is used to track this degradation and the term is often defined as the ratio of current battery performance to its performance at nameplate conditions. Several indicators can be used to estimate the SOH of an energy storage device, including changes in capacity, changes in resistance, charge throughput and cycle count.

The most commonly used metric for estimating SOH is amp hour capacity, where SOH is expressed as the ratio of the total available capacity to the nameplate capacity. Definition of SOH in terms of amp hour capacity can be problematic, however, because decisions about energy storage applications are often based on available energy, measured in Wh. Consideration of available energy is especially important for second-life application, where electric vehicle packs have been repurposed for stationary purposes. Moreover, the economic feasibility of any long-life energy storage system built to last 10-20 years or more is often based on the amount of energy that can be delivered.

Therefore, accurate SOH estimation algorithms, based on energy, are essential for making optimal decisions with regards to the operation, control, and maintenance of energy storage systems. New systems and methods for more accurately estimating the SOH based on energy performance would be desirable.

SUMMARY

In accordance with an example embodiment, a state of health (SOH) estimation system, for determining an estimate of the SOH for an energy storage device that accounts for both power fade and capacity fade, is disclosed. In an example embodiment, the SOH estimation system comprises: a SOH estimation module configured to receive, and to determine an estimate of the SOH of the energy storage device based on: a nominal capacity input representing a nominal capacity of the energy storage device; a voltage input, V, representing a measured voltage associated with the energy storage device; a current input, I, representing a measured current from/to the energy storage device; a nominal open circuit voltage (OCV) curve associated with the energy storage device; an operational resistance model associated with the energy storage device; a nominal resistance model associated with the energy storage device; an operational dynamic model associated with the energy storage device; and a rated discharge current associated with the energy storage device.

In accordance with another example embodiment, a method of determining an estimate of a state of health (SOH), for an energy storage device, that accounts for both power fade and capacity fade, is disclosed. In an example embodiment the method comprises: receiving, at a SOH estimation module, the following information (received information): a nominal capacity input representing a nominal capacity of the energy storage device; a voltage input V representing a measured voltage associated with the energy storage device; a current input I representing a measured current from/to the energy storage device; a nominal open circuit voltage OCV curve associated with the energy storage device; an operational resistance model associated with the energy storage device; a nominal resistance model associated with the energy storage device; an operational dynamic model associated with the energy storage device; and a rated discharge current associated with the energy storage device. The method further comprises determining, at the SOH estimation module, the estimate of the SOH for the energy storage device based on all of the received information.

In accordance with another example embodiment, a normalized capacity estimation system, for generating a normalized capacity estimate for an energy storage device, is disclosed. In an example embodiment, the normalized capacity estimation system comprises: a voltage sensor for sensing a voltage associated with the energy storage device and generating a voltage signal; a current sensor for sensing the current associated with the energy storage device and generating a current signal; an operational dynamic model associated with the energy storage device; a nominal OCV curve associated with the energy storage device; a nominal capacity associated with the energy storage device; and a normalized capacity estimation module configured to receive the voltage signal, the current signal, the operational dynamic model, and the nominal capacity and to generate the normalized capacity estimate based on the voltage signal, the current signal, the operational dynamic model, the nominal OCV curve and the nominal capacity; wherein the normalized capacity estimate is generated from the difference between two distinct OCV predictions and filtered based upon (1) the difference between the two distinct OCV predictions and a difference threshold and (2) the gradient of OCV curve at the two distinct OCV predictions and a gradient threshold.

In accordance with another example embodiment, a power rating estimation system, for generating a power rating estimate for an energy storage device, is disclosed. In an example embodiment, the power rating estimation system comprises: a power rating estimation module configured to receive: a nominal resistance model, associated with the energy storage device, from a nominal resistance model module; an operational resistance model, associated with the energy storage device, from an operational resistance model module; a rated discharge current, associated with the energy storage device, from a rated discharge current module; and a nominal OCV curve, associated with the energy storage device, from a nominal OCV curve module. In this example embodiment, the power rating estimation module is configured to generate a power rating estimate based on the nominal resistance model, the operational resistance model, the rated discharge current and the nominal OCV curve; the operational resistance model and the nominal resistance model are each based on a voltage signal from a voltage sensor and a current signal from a current sensor; and the power rating estimate is generated by (1) predicting operational voltages based on the operational resistance model and the rated discharge current, (2) predicting nominal voltages based on the nominal resistance model and the rated discharge current, (3) averaging a ratio of the predicted operational voltages to the predicted nominal voltages across the entire OCV curve.

BRIEF DESCRIPTION OF THE DRAWING FIGURES

Additional aspects of the present disclosure will become evident upon reviewing the non-limiting embodiments described in the specification and the claims taken in conjunction with the accompanying figures, wherein like numerals designate like elements, and:

DETAILED DESCRIPTION

Figure 1A:
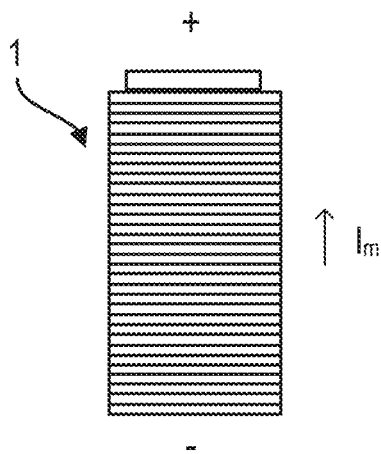
FIG. 1A is a diagram illustrating an example energy storage cell.

Reference will now be made to the exemplary embodiments illustrated in the drawings, and specific language will be used herein to describe the same. It will nevertheless be understood that no limitation of the scope of the disclosure is thereby intended. Alterations and further modifications of the inventive features illustrated herein, and additional applications of the principles of the disclosure as illustrated herein, which would occur to one skilled in the relevant art and having possession of this disclosure, are to be considered within the scope of the disclosure.

SOH Estimation System

In accordance with an example embodiment, systems, devices and methods are disclosed herein for providing state-of-health estimation in an energy storage system and/or energy storage device(s). Moreover, in an example embodiment, a SOH estimation system, devices and methods are provided for accurately estimating the SOH of an energy storage device at one or more of the cell, module, stack, and bank levels.

There are two main limitations with existing techniques that are addressed by the SOH estimation system of the present disclosure. First, capacity is often estimated jointly with other cell parameters, often resulting in unstable and inaccurate estimates. Additionally, incorrect estimates can be generated if estimation is carried out when insufficient information is present in the measurement data. In accordance with an example embodiment, a method is disclosed that resolves these issues through a normalized capacity estimation method that decouples capacity and parameter estimation. Parameter model estimation and capacity estimation can be performed at different points in time as needed, producing a more robust and accurate estimate. In addition, the disclosed example method incorporates model gradient information to intelligently update estimates only when sufficient information is present in the measurement data.

Figure 5:
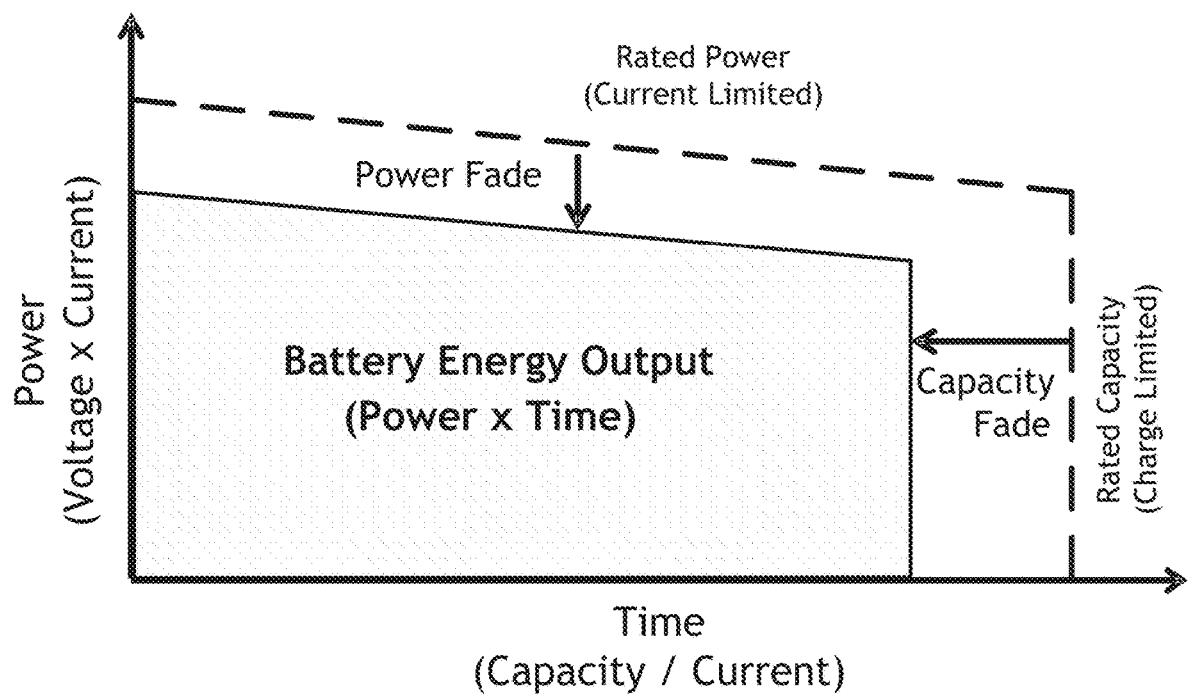
FIG. 5 is an example battery energy output graph.

Second, typical methods of determining the SOH of a battery are based solely on capacity estimates. However, these typical methods do not account for other changes in the energy storage device. For example, these typical methods do not account for power fade. Power fade may occur due to an increase over time in internal impedance of the energy storage device. Not accounting for both capacity fade and power fade can result in an inaccurate depiction of the energy storage device's performance, particularly for high powered applications. With reference to FIG. 5, the amount of power that can be delivered is current limited by the design of the ESS. In a similar way, the amount of charge available is limited by the battery chemistry and capacity. Over time, power fade and capacity fade will reduce the total energy as shown in FIG. 5 due to battery degradation. The proposed method can improve SOH accuracy by accounting for both of these mechanisms. In addition, incorporating the rated discharge current can provide a unified approach for estimating SOH based on power fade for both high power and low power/high energy applications. Therefore, the estimated SOH can change depending on the rated operating discharge current of the ESS.

In an example embodiment, a state-of-health (SOH) estimation system is disclosed for determining an estimate of the SOH for an energy storage device that accounts for both power fade and capacity fade. In an example embodiment, the SOH estimation system comprises a SOH aggregation module that determines a SOH estimate, SOH, for an energy storage device that is based on a normalized capacity estimate, $NC_n$, and a power rating estimate, $PR_n$, for each of the cells, cells 1 through N, in the energy storage system.

Figure 2A:
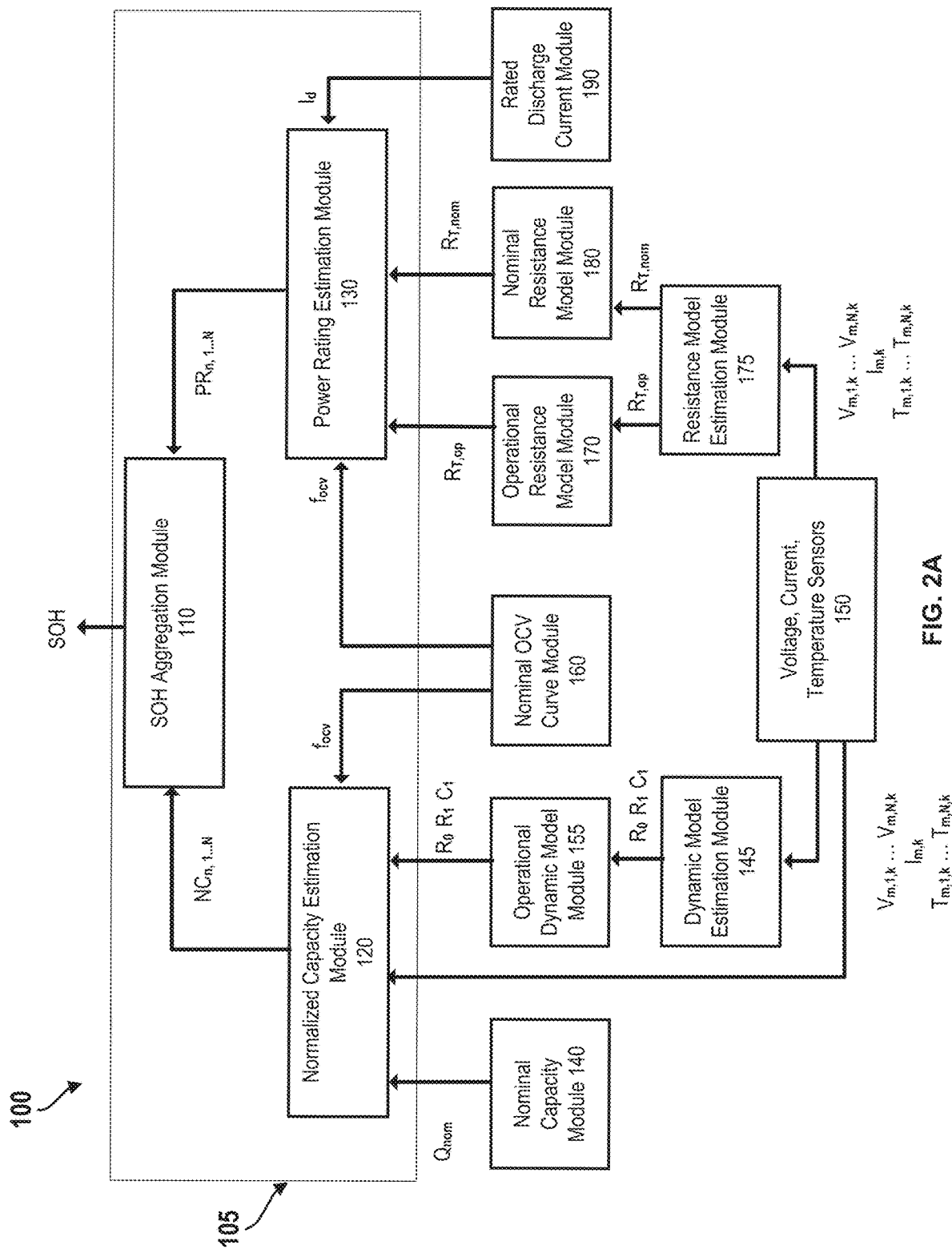
FIGS. 2A-2D are block diagrams illustrating example state-of-health estimation systems.

With reference now to FIG. 2A, in an example embodiment, a SOH estimation system 100 comprises a SOH estimation module 105. In this example embodiment, the SOH estimation module 105 may be configured to receive the following information (received information): a nominal capacity, $Q_{nom}$, representing the nominal capacity of the energy storage device; a voltage input representing a measured voltage, $V_m$, of the energy storage device; a current input representing a measured current, $I_m$, from/to the energy storage device; a nominal open circuit voltage (OCV) curve, $f_{ocv}$, associated with the energy storage device; an operational resistance model, $R_{T,op}$, associated with the energy storage device; an operational dynamic model module, ($R_0$, $R_1$, $C_1$), associated with the energy storage device; a nominal resistance model, $R_{T,nom}$, associated with the energy storage device; and a rated discharge current, $I_d$, associated with the energy storage device. In an example embodiment, the SOH estimation module 105 is configured to determine the estimate of the operational SOH, for the energy storage device based on all of the received information. In an example embodiment, the SOH estimation module 105 is further configured to receive and the received information further comprises a temperature input, $T_m$, representing a temperature associated with the energy storage device. In an example embodiment, the SOH estimation module 105 is configured to output the estimated SOH. The estimated SOH accounts for a majority of the degradation mechanisms that occur within the cells of the energy storage device.

SOH Aggregation Module 110

In accordance with an example embodiment, the SOH estimation module 105 may further comprise a SOH aggregation module 110 that determines a SOH estimate, SOH, for the energy storage device. In an example embodiment, the SOH aggregation module 110 is configured to receive a normalized capacity estimate, $NC_n$, for each of the cells, cells 1 through N, in the energy storage system; to receive a power rating estimate, $PR_n$, for each of the cells, cells 1 through N, in the energy storage system; and to output a SOH estimate, for the energy storage device. In an example embodiment, the SOH estimate, incorporates both power fade and capacity fade. In an example embodiment, the SOH estimate may be considered an "operational SOH estimate" because one or both of the normalized capacity estimate and the power rating estimate, and thus the SOH estimate, reflect the actual operation of the energy storage system (i.e., the way it is operated and the environment in which it is operated).

In an example embodiment, the SOH estimate can be determined by multiplying the minimum normalized capacity estimate (of cells 1 to N) by an average of the individual power ratings for the energy storage system and then multiplying that result by 100 to get a percentage. In other words, normalized capacity estimates and the power rating estimates of cells 1 to N are aggregated together to generate a single SOH value. Thus, in one example embodiment the SOH may be calculated by $$SOH = 100 * \min_{1 \leq n \leq N}(NC_n) \frac{1}{N} \sum_{n=1}^{N} PR_n$$

where $PR_n$ is the power rating estimate for the nth cell, of cells 1 through N, in the energy storage system and $NC_n$ is the normalized capacity estimate of the nth cell, of cells 1 through N, in the energy storage system. It should be understood that $PR_n$ is unitless and represents the power fade experienced by the energy storage device. It should also be understood that $NC_n$ is unitless and represents the degree of capacity fade experienced by the energy storage device. Multiplying the normalized capacity estimate with the power rating estimate ensures that the SOH value is based on energy capacity not merely amp-hour capacity. Stated another way, in an example embodiment, the SOH aggregation module 110 is configured to scale the SOH estimate based on the normalized capacity estimate and/or the power rating estimate. This is a significant advantage over SOH methods that are based exclusively on amp-hour capacity since most economic and operational decisions are based on energy considerations.

In an example embodiment, the normalized capacity estimate $NC_n$ can be split into normalized charge capacity $NC_{c,n}$ and normalized discharge capacity $NC_{d,n}$ to account for cell imbalance within the estimated SOH. Thus, in one example embodiment the SOH may be calculated by $$SOH = 100 * (\min_{1 \leq x \leq N}(NC_{d,x}) + \min_{1 \leq y \leq N}(NC_{c,y})) \frac{1}{N} \sum_{n=1}^{N} PR_n$$

The term $\min_{1 \leq x \leq N}(NC_{d,x})$ represents the amount of charge that can be removed from the energy storage device without over discharging the least charged cell. The term $\min_{1 \leq y \leq N}(NC_{c,y})$ represents the amount of charge that can be accepted by the energy storage device without over charging the most charged cell. The sum of the two terms represents the total usable capacity that accounts for both imbalance and capacity fade. The reduction in capacity due to imbalance can be recovered by balancing the energy storage device. Example methods for calculating the normalized charge capacity $NC_c$ and normalized discharge capacity $NC_d$ are describe in further detail herein.

This method of determining the SOH estimate may be applied to any energy storage device (e.g., at the cell, module, stack, or bank levels, to series and parallel combinations of N cells). That is to say that the same device, system and method of determining the aggregate SOH estimate may be used whether the energy storage device is a cell, a module, a stack, or a bank. At a cell level, N=1 and the method provides an aggregate SOH estimate for the single cell. At the module level, the module has N cells, and the method provides an aggregate SOH estimate for the overall module. Similarly, at the stack level, the stack may comprise N cells and the method provides an aggregate SOH estimate for the overall stack of cells. Similarly, at the bank level, the bank may comprise N cells and the method provides an aggregate SOH estimate for the overall bank of cells. Moreover, this method of determining the SOH estimate may be applied at the energy storage system level.

Normalized Capacity Estimation Module 120

In an example embodiment, the SOH estimation system 100 further comprises a normalized capacity estimation module 120. In an example embodiment, the SOH estimation module 105 may comprise the normalized capacity estimation module 120. In an example embodiment, normalized capacity estimation module 120 is configured to receive a nominal capacity. The normalized capacity estimation module 120 may be configured to receive the nominal capacity from a nominal capacity module 140. In an example embodiment, normalized capacity estimation module 120 is configured to receive a measured voltage, measured temperature, and/or measured current. The normalized capacity estimation module 120 may be configured to receive these measured characteristics from sensors 150. In an example embodiment, normalized capacity estimation module 120 is configured to receive a nominal Open Circuit Voltage (OCV) curve. The normalized capacity estimation module 120 may be configured to receive the nominal OCV curve, $f_{ocv}$, from a nominal OCV curve module 160. In an example embodiment, normalized capacity estimation module 120 is configured to receive an operational dynamic model. The normalized capacity estimation module 120 may be configured to receive the operational dynamic model from an operational dynamic model module 155.

In an example embodiment, the normalized capacity estimation module 120 is configured to generate a filtered normalized capacity estimate, $NC_n$, for each cell of cells 1 through N, based on the received nominal capacity, $Q_{nom}$, measured voltage, $V_{m,n}$, measured current, $I_m$, measured temperature, $T_{m,n}$, nominal OCV curve, $f_{ocv}$, and operational dynamic model, $R_0$, $R_1$, $C_1$. In an example embodiment, the filtered normalized capacity estimate, $NC_n$, is a percentage of the nominal capacity, $Q_{nom}$. For example, the filtered normalized capacity estimate, $NC_n$, may be determined by dividing a filtered capacity estimate $Q_{f,n}$ (described in more detail below) by the nominal capacity, $Q_{nom}$. In an example embodiment, the normalized capacity estimation module 120 is configured to provide that filtered normalized capacity estimate, $NC_n$, to the SOH aggregation module 110. Example methods for calculating the normalized capacity estimate are describe in further detail herein.

In an example embodiment, the normalized capacity estimation module 120 is configured to predict an open circuit voltage based on the operational dynamic model, $R_0$, $R_1$, $C_1$ the measured voltage $V_m$, and measured current, $I_m$. As described in more detail herein, in an example embodiment, the normalized capacity estimation module 120 is configured to determine a normalized capacity estimate based on the predicted open circuit voltage, the nominal capacity $Q_{nom}$ and the measured current $I_m$.

Power Rating Estimation Module 130

In an example embodiment, the SOH estimation system 100 further comprises a power rating estimation module 130. In an example embodiment, the SOH estimation module 105 may comprise the power rating estimation module 130. In an example embodiment, power rating estimation module 130 is configured to receive a nominal Open Circuit Voltage (OCV) curve. The power rating estimation module 130 may be configured to receive the nominal OCV curve, $f_{ocv}$, from a nominal OCV curve module 160. In an example embodiment, power rating estimation module 130 is configured to receive an operational resistance model. The power rating estimation module 130 may be configured to receive the operational resistance model from an operational resistance model module 170. In an example embodiment, power rating estimation module 130 is configured to receive a nominal resistance model. The power rating estimation module 130 may be configured to receive the nominal resistance model from nominal resistance model module 180. In an example embodiment, power rating estimation module 130 is configured to receive a rated discharge current. The power rating estimation module 130 may be configured to receive the rated discharge current from rated discharge current module 190.

In an example embodiment, the power rating estimation module 130 is configured to determine a power rating estimate, based on the rated discharge current $I_d$, the operational resistance model $R_{T,op}$, the nominal resistance model $R_{T,nom}$ and the nominal OCV curve $f_{ocv}$. As described further herein, the power rating estimate is determined by taking the ratio of the predicted terminal voltage based on the operational resistance model to the predicted terminal voltage based on the nominal resistance model.

Energy Storage System (ESS)

In accordance with various example embodiments, an energy storage system ("ESS") is a system that stores and releases electrical charge. In an example embodiment, the ESS may comprise one or more energy storage devices, a battery management system, sensors, inverters, and/or the like.

Energy Storage Device

In an example embodiment, the energy storage device may comprise electrochemical cells, such as lead-acid batteries, nickel-cadmium batteries, nickel-metal hydride batteries, lithium-ion batteries, lithium-ion polymer batteries, zinc-air batteries, and/or the like. In another example embodiment, the energy storage device may comprise flow batteries. In yet another example embodiment, the energy storage device may comprise super-capacitors. Moreover, the energy storage device may comprise any suitable rechargeable energy storage system for which a SOH estimation is relevant. In an example embodiment, the energy storage device may comprise a single cell, multiple cells, a stack, a module, a bank, or a pack.

Cell

In the various example embodiments described herein, and with reference to FIG. 1A, an ESS may comprise, in an example embodiment, a battery cell 1, or simply "cell" for short. In an example embodiment, the cell 1 comprises a single anode and cathode separated by electrolyte and is used to store and release electrical charge. However, other cell designs may also be used, such as in flow batteries. Multiple anodes and cathodes may be joined together in parallel or series arrangements to produce cells that operate at higher voltage or current levels. In one example embodiment, the cell may be the smallest measurable unit of energy storage within an ESS. The current flowing through the cell 1 is denoted $I_m$, for measured current, where a positive current flows out of the positive terminal. A typical cell can be physically arranged as a cylindrical cell, such as the 18650 and 21700 cylindrical lithium-ion format cells, button cells, prismatic cells, pouch cells, and/or the like. In another example embodiment, a cell may comprise a super-capacitor. Moreover, a cell may comprise any chemistry and format suitable for rechargeable energy storage where SOH estimation is relevant. Generally, the cell 1 may be any rechargeable energy storage device with connection points for a single voltage measurement. The systems, methods, and devices described herein may provide improved SOH estimation for the cell 1.

Module

Figure 1B:
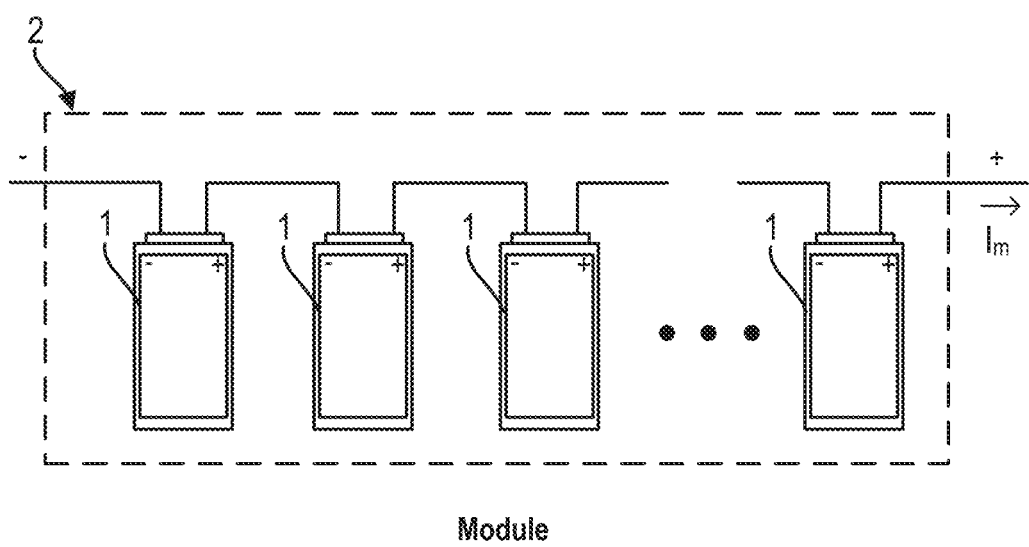
FIG. 1B is a diagram illustrating an example energy storage module.

Moreover, an ESS may comprise, in an example embodiment, and with reference to FIG. 1B, a battery module 2, or simply "module" for short. A module 2 may comprise two or more cells connected in series or parallel arrangements or both series and parallel arrangements and grouped together. In one example embodiment, a lead-acid automotive battery comprises a module that is made-up of six cells with only two connection points for overall voltage measurement. In another example embodiment, a lithium-ion battery module comprises a module with 12 series connected cells, each with individual connection points for cell voltage measurement. A module 2 may be the smallest measurable unit in the ESS, if the individual cells are integrated into the module in such a way that measurement of voltage from the individual cells is not convenient. The current flowing through the module 2 is denoted $I_m$, where a positive current flows out of the most positive cell terminal. Moreover, a module can be any energy storage device comprising a group of two or more cells with connection points for one or more voltage measurement(s). The systems, methods, and devices described herein may provide improved SOH estimation for the module 2.

Stack

Figure 1C:
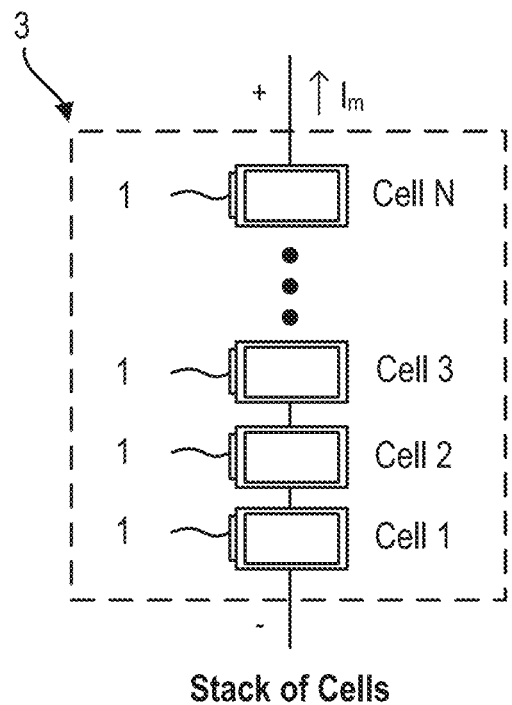
FIG. 1C is a diagram illustrating an example energy storage stack of cells.
Figure 1D:
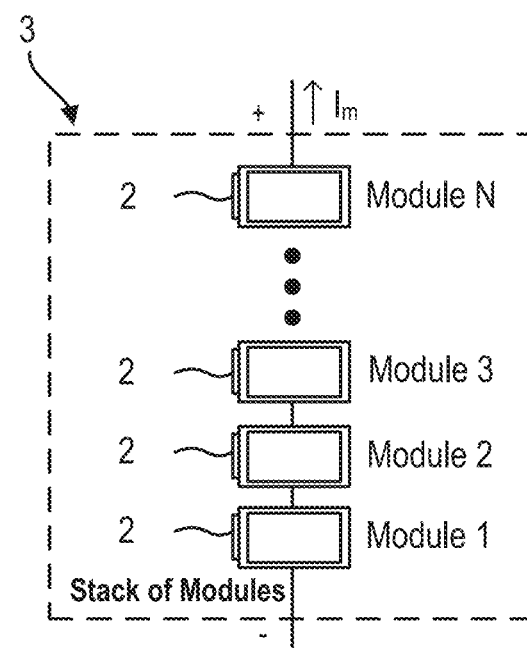
FIG. 1D is a diagram illustrating an example energy storage stack of modules.

Moreover, an ESS may comprise, in an example embodiment, and with reference to FIG. 1C, a battery stack 3, or simply "stack." The stack 3, in an example embodiment, comprises multiple cells 1 electrically connected in series. Thus, in an example embodiment, a stack 3 may comprise N cells, and the cells may be noted as cell n wherein n=1 to N. It will be understood that N may be any positive integer number. For N=1 the stack is a single cell. For N>1, the stack is a number of cells, N. In another example embodiment, and with reference to FIG. 1D, the stack 3, comprises multiple modules 2 electrically connected in series. Thus, in an example embodiment, a stack 3 may comprise N modules, and the modules may be noted as module n, wherein n=1 to N. It will be understood that N may be any positive integer number. For N=1 the stack is a single module. For N>1, the stack is a number of modules, N. The current flowing through the stack 3 is denoted $I_m$, where a positive current flows out of the most positive cell or module terminal. The systems, methods, and devices described herein may provide improved SOH estimation for the stack 3.

Bank

Figure 1E:
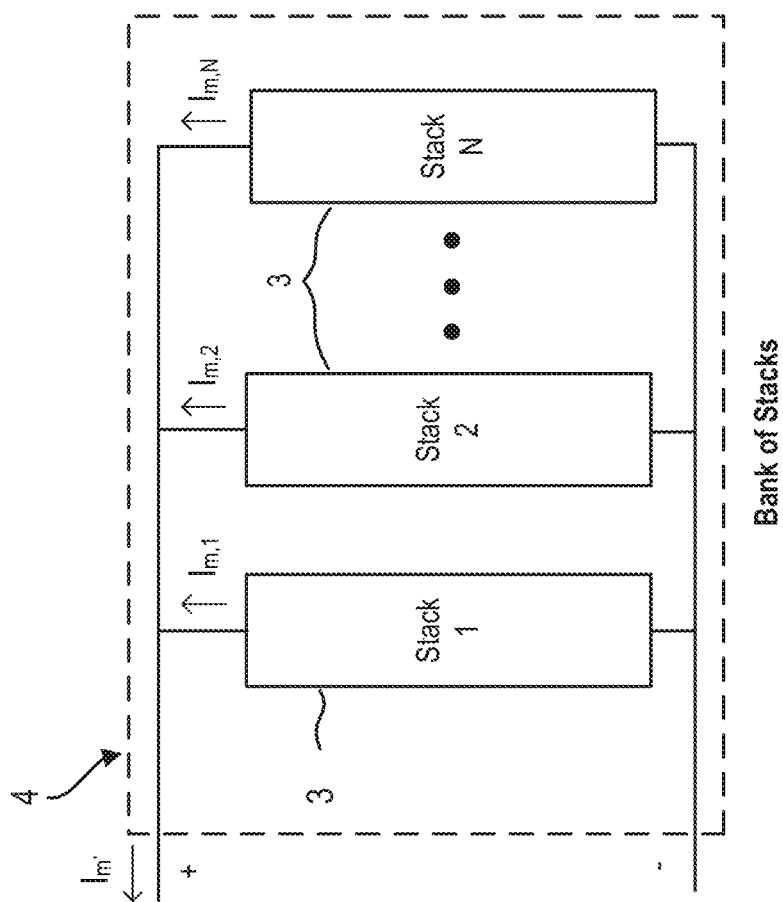
FIG. 1E is a diagram illustrating an example energy storage bank of stacks.

Moreover, an ESS may comprise, in an example embodiment, and with reference to FIG. 1E, a battery bank 4, or simply "bank." The bank 4, in an example embodiment, comprises multiple stacks 3, electrically connected in parallel. Thus, in an example embodiment, a bank 4 may comprise N stacks, and the stacks may be noted as stack n, wherein n=1 to N. It will be understood that N may be any positive integer number. For N=1 the bank is a single stack. For N>1, the bank is a number of stacks, N. The current flowing through the bank 4 is denoted $I_m$, which is also electrically equivalent to the sum of the individual stack currents $I_{m,1 \ldots N}$. The number of stacks included within the bank 4 may change over time dynamically if one or more stack(s) can be connected or disconnected from the bank using contactors, circuit breakers, solid-state switches, or any other suitable means of making or breaking current flow. The systems, methods, and devices described herein may provide improved SOH estimation for the bank 4.

Nominal Capacity Module 140

With reference to FIG. 2A, in an example embodiment the SOH estimation system 100 may comprise a nominal capacity module 140. In this example embodiment, the nominal capacity module 140 is configured to provide a theoretical cell capacity of a new cell, $Q_{nom}$ to the normalized capacity estimation module 120. The nominal capacity may have units of Ampere Hours. The nominal capacity, $Q_{nom}$, may be a single number provided, for example by the manufacturer, such as by way of manufacturing spec sheets for a particular model of energy storage device. In an example embodiment, the nominal capacity can be taken as the total charge within a smaller range of the full OCV curve. In an example embodiment, the nominal capacity, $Q_{nom}$, is constant for the life of the energy storage system. However, in other example embodiments, the $Q_{nom}$ provided to normalized capacity estimation module 120 may be adjusted to account for changes in temperature or other factors.

Sensors 150

In an example embodiment the SOH estimation system 100 may comprise voltage, current and/or temperature sensors 150. In this example embodiment, normalized capacity estimation module 120 is configured to receive voltage, current, and/or temperature signals. These signals may provide information representative of the voltage, current and/or temperature, respectively, of the energy storage device. In an example embodiment, these signals and this information may be measured by sensors 150 associated with the energy storage device. However, as set forth below, in some instances the signals can be not based on direct measurement.

In an example embodiment, the normalized capacity estimation module 120 may be configured to receive the voltage signal from a voltage sensor(s). The voltage sensors can be any suitable type of voltage sensor, such as a resistive or capacitive voltage sense circuit followed by a suitable filter and an analog-to-digital converter. In an example embodiment, individual voltage sensors may be associated with each cell, of cells 1 through N, of the energy storage system. In this example embodiment, each voltage sensor may be configured to measure the voltage of the associated cell and produce a voltage measurement $V_m$. The voltage measurements may be taken at any suitable interval, over time, and the separate measurements are denoted herein by the subscript k, representing each time step. Thus, sensors 150 may provide to the normalized capacity estimation module 120 a series (over time steps denoted by k) of N cell-level voltage measurements as represented by $V_{m,1,k}$, $V_{m,2,k} \ldots V_{m,N,k}$. Stated another way, $V_{m,n,k}$ may represent the measured voltage of the $n^{th}$ cell at the $k^{th}$ time step.

In an example embodiment, the normalized capacity estimation module 120 may be configured to receive the current signal from a current sensor. The current sensor can be any suitable type of current sensor, such as a resistive shunt or a magnetic hall effect sensor followed by a suitable filter and an analog-to-digital converter. In an example embodiment, a single current sensor or multiple current sensors may be associated with the energy storage device, regardless of the number of cells. For example, the current sensor may measure the flow of current to or away from the energy storage device. A single current measurement may be taken at any suitable interval, over time, and the current measurements are denoted herein by the subscript k, representing each time step. Thus, sensors 150 may provide to the normalized capacity estimation module 120 a series (over time steps denoted by k) of energy storage unit current measurements as represented by $I_{m,k}$. Stated another way, $I_{m,k}$ may represent the measured current at the kth time step for the energy storage device.

In an example embodiment, the normalized capacity estimation module 120 may be configured to receive the temperature signal from a temperature sensor. The temperature sensor can be any suitable type of temperature sensor, such as a resistive thermistor or a thermocouple followed by a suitable filter and an analog-to-digital converter. In an example embodiment, a number of temperature sensors may be respectively associated with each cell, of cells 1 through N of the energy storage device. For example, each temperature sensor may measure the temperature of a particular cell. Thus, temperature measurements $T_m$ may be taken for each of the N cells at any suitable interval, over time, and the temperature measurements are denoted herein by the subscript k, representing each time step. Thus, sensors 150 may provide to the normalized capacity estimation module 120 a series (over time steps denoted by k) of energy storage unit cell level temperature measurements as represented by $T_{m,1,k}$, $T_{m,2,k} \ldots T_{m,N,k}$. Stated another way, $T_{m,n,k}$ may represent the measured temperature of the $n^{th}$ cell at the $k^{th}$ time step. In other example embodiments, there may be fewer than N physical temperature sensors. In this example embodiment, an interpolation or weighted average function may be used to generate N cell temperatures from fewer than N physical sensors. Moreover, in another example embodiment, the temperature measurement $T_m$ may be estimated, assumed, looked up from a table, or otherwise derived.

In accordance with another example embodiment, the voltage, current and/or temperature measurements may be provided to dynamic model estimation module 145. In accordance with another example embodiment, the voltage, current and/or temperature measurements may be provided to resistance model estimation module 175.

Nominal OCV Curve Module 160

In an example embodiment, the SOH estimation system 100 further comprises a nominal OCV curve module 160. In an example embodiment, the nominal OCV curve module 160 provides a nominal OCV curve, $f_{ocv}(SOC)$, that is a function of the state-of-charge, to the normalized capacity estimation module 120. In an example embodiment, the nominal OCV curve module 160 provides a nominal OCV curve, $f_{ocv}(SOC)$, that is a function of the state-of-charge, to the power rating estimation module 130. The nominal OCV curve represents the open-circuit voltage as a function of state-of-charge for a new cell or module or stack. This can be provided by the manufacturer, or can be determined empirically through testing of the energy storage device itself or similar energy storage devices. The nominal OCV curve may be a function or may be a look-up table-based function. Thus, in one example embodiment, the nominal OCV curve is determined once and does not change over time. However, in other example embodiments, the nominal OCV curve may be adjusted over time to account for changes in temperature or other factors. In an example embodiment, two different OCV curves maybe used, one for charge and the other for discharge.

Equivalent Circuit Model Diagram

Figure 3:
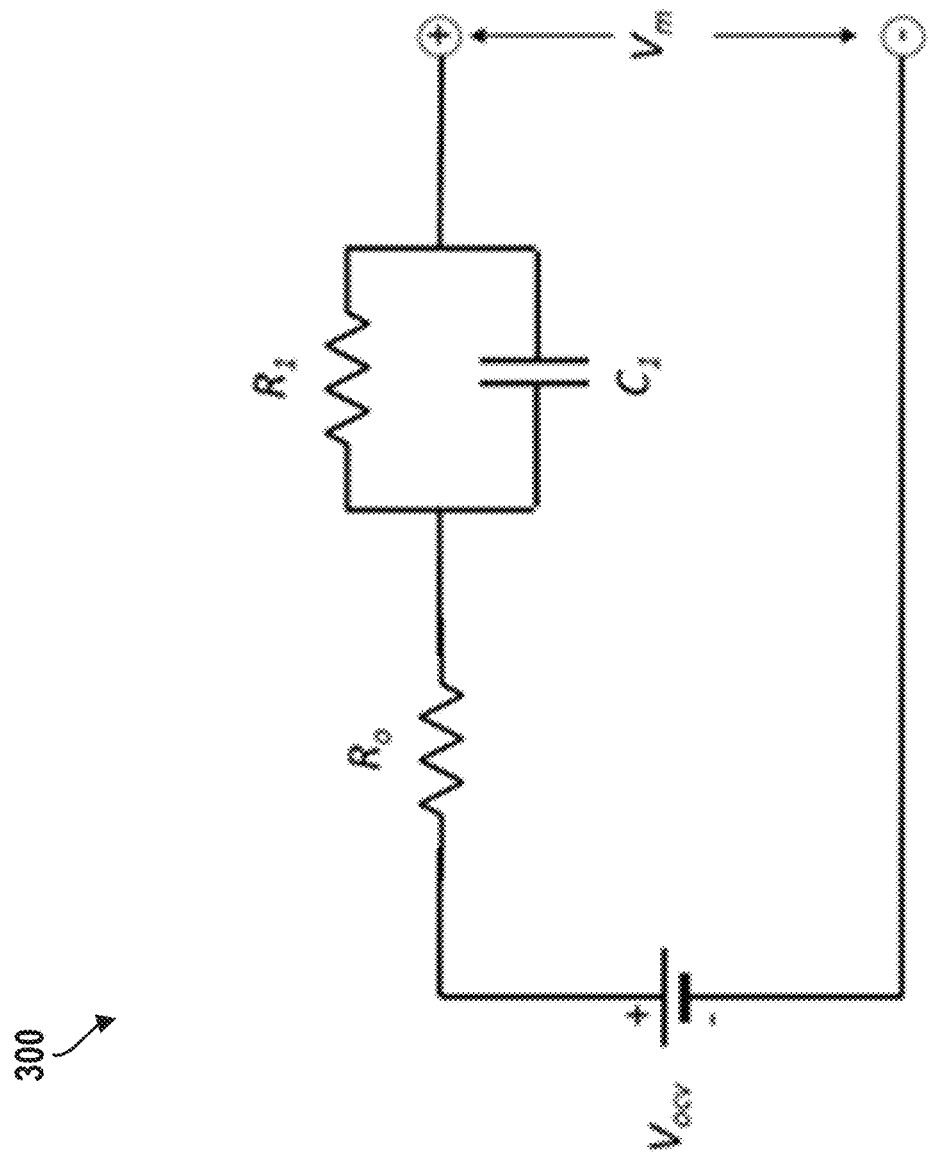
FIG. 3 is an equivalent circuit model diagram for an example energy storage device.

With reference now to FIG. 3, the battery cell may be represented by an Equivalent Circuit Model (ECM) Diagram 300. Although various calculations are described herein based on ECM Diagram 300, it should be understood that similar calculation may be based off of other ECM's in implementing the concepts described herein applied to energy storage systems or energy storage device(s). The ECM diagram 300 models the voltage response of the cell in operation. There are three main components in the equivalent circuit model (ECM): the open-circuit voltage ($V_{ocv}$), a resistor ($R_0$) and one resistor-capacitor pair ($R_1$ and $C_1$). It is noted that other ECM's may include more or different parameters.

The open-circuit voltage, $V_{ocv}$, represents the cell's thermodynamic potential at rest. The value of the open-circuit voltage can change based on the cell's state-of-charge. A single resistor component, $R_0$, is used to represent the cell's ohmic losses. This resistance is the sum of ohmic losses experienced at both electrodes as well as at the electrolyte. In an example embodiment, $R_{0,n}$, represents the ohmic resistance of the $n^{th}$ cell. The resistor ($R_1$) capacitor ($C_1$) pair in the ECM is used to model the time-dependent voltage drop within the cell. In an example embodiment, $R_{1,n}$ represents the polarization resistance of the RC pair of the nth cell. In an example embodiment, $C_{1,n}$ represents the polarization capacitance of the RC pair of the $n^{th}$ cell. The voltage drop across this RC pair is caused by specific chemical reactions that occur within the cell and is represented as $V_1$ herein.

Resistance Model Estimation Module 175

In accordance with an example embodiment, SOH estimation system 100 comprises a resistance model estimation module 175. Resistance model estimation module 175 may be configured to receive voltage, current and temperature measurements from sensors 150. Typically, only current and voltage measurements are required for online estimation methods. However, in other example embodiments, all three measurements may be necessary, such as when using offline techniques. The voltage and temperature measurements may be for each cell of the N cells of the energy storage device. However, in other example embodiments, the temperature measurement may be determined in other ways (assumed, averaged, estimated, etc.). In an example embodiment, resistance model estimation module 175 may be configured to calculate (as described further below) the operational resistance model, $R_{T,op}$, and provide it to operational resistance model module 170. In an example embodiment, resistance model estimation module 175 may be configured to calculate (as described further below) the nominal resistance model, $R_{T,nom}$, and provide it to nominal resistance model module 180.

Dynamic Model Estimation Modules 145

In accordance with an example embodiment, SOH estimation system 100 comprises a dynamic model estimation module 145. Dynamic model estimation module 145 may be configured to receive voltage, current and temperature measurements from sensors 150. The voltage and temperature measurements may be for each cell of the N cells of the energy storage device. However, in other example embodiments, the temperature measurement may be determined in other ways (assumed, averaged, estimated, etc.). In an example embodiment, dynamic model estimation module 145 may be configured to calculate (as described further below) the operational dynamic model ($R_0$, $R_1$ and $C_1$) and provide it to operational dynamic model module 155.

Techniques for Estimation

In an example embodiment, the dynamic model estimation module 145 and the resistance model estimation module 175 comprise off-line approaches for estimating the operational dynamic model ($R_0$, $R_1$ and $C_1$), the nominal resistance model ($R_{T,nom}$) and the operational resistance model ($R_{T,op}$), respectively. In an example embodiment, this approach involves using empirical models that describe how each of these five parameters change with temperature and open-circuit voltage. In an example embodiment, a cell can be modeled by five equations:

$$f_p(T, V) = \beta_{0,p} + \beta_{1,p}T + \beta_{2,p}V + \beta_{3,p}T^2 + \beta_{4,p}V^2 + \beta_{5,p}(T*V) + \beta_{6,p}(T_m^2*V) + \beta_{7,p}(V^2*T) + \beta_{8,p}(T^2*V^2)$$

where the subscript p represents $R_0$, $R_1$, $C_1$, $R_{T,op}$, $R_{T,nom}$. In other words, the single equation above represents a first equation for $f_{R0}(T,V)$, a second equation for $f_{R1}(T,V)$, a third equation for $f_{C1}(T,V)$, a fourth equation for $f_{RT,nom}(T,V)$ and a fifth equation for $f_{RT,op}(T,V)$. Thus, in an example embodiment a unique parameter model is provided for each of these parameters. In this approach, a hybrid pulse power characterization (HPPC) test is conducted outside of normal operation and the output voltage, current and the temperature are recorded. The HPPC test can be conducted within a narrow voltage and OCV range or at several temperatures and OCV points. When conducting the test at multiple operating conditions, a design of experiments approach, described in M. Mathew, M. Mastali, J. Catton, E. Samadani, S. Janhunen, and M. Fowler, "Development of an electro-thermal model for electric vehicles using a design of experiments approach" Batteries 4(2), 2018, can be used to minimize the testing time. The voltage and current data from the HPPC experiment can be used in a non-linear regression approach to determine the coefficients of the model $\beta_{0,p} \ldots \beta_{8,p}$ for a specific cell n. Moreover, any suitable method of obtaining parameters of a model of the ECM may be used.

In an example embodiment, the dynamic model estimation module 145 and/or the resistance model estimation module 175 may be configured to use an on-line approach to estimate the operational dynamic model ($R_0$, $R_1$ and $C_1$) (in the case of the dynamic model estimation module 145), and the nominal resistance model ($R_{T,nom}$) and the operational resistance model ($R_{T,op}$)(in the case of the resistance model estimation module 175). The on-line mode may also be referred to herein as a "monitoring" mode. In this example embodiment, the operation of the energy storage system is uninterrupted by the updating or "generation" of the operational dynamic model and the operational resistance model. In this monitoring mode, the dynamic model estimation module 145 or the resistance model estimation module 175 is configured, for example, to update the operational dynamic model or resistance model based on an on-line estimation approach such as extended Kalman filter (EKF) or recursive least squares (RLS). The dynamic model estimation module 145 or resistance model estimation module 175 is configured to opportunistically perform this calculation during charging and discharging activity of the energy storage system. Thus, the operational dynamic model or operational resistance model can be updated in this monitoring mode without interrupting operation of the energy storage device. This is the fastest and most convenient approach. However, any suitable online method for obtaining parameters for the ECM may be used.

Thus, in an example embodiment, dynamic model estimation module 145 is configured to update an operational dynamic model, ($R_0$, $R_1$, $C_1$), and/or resistance model estimation module 175 is configured to update the operational resistance model $R_{T,op}$ and/or the nominal resistance model $R_{T,nom}$. In an example embodiment, the dynamic model estimation module 145 is configured to provide the operational dynamic model, ($R_0$, $R_1$, $C_1$), to operational dynamic model module 155. In an example embodiment, the resistance model estimation module 175 is configured to provide the operational resistance model to the operational resistance model module 170 and/or to provide the nominal resistance model to the nominal resistance model module 180. In an example embodiment, the output models from dynamic model estimation module 145 and from resistance model estimation module 175 may be used in subsequent modules to determine an estimate of the SOH of the energy storage system. Thus, in one example embodiment the systems and methods disclosed herein can determine an estimate of the SOH of the energy storage system by monitoring the energy storage system during normal operation. In this example embodiment, the energy storage system operation does not need to be interrupted to determine the estimate of the SOH. However, as described herein, alternative test methods may be employed within the scope of this disclosure for determining the estimate of the SOH. In either case, the accuracy of the estimate of SOH may be improved by basing it on both the capacity estimate and the power rating estimate.

In an example embodiment, the operational dynamic model, operational resistance model or nominal resistance model is generated locally, meaning at the energy storage device's physical location, but in other example embodiments, the operational dynamic model, operational resistance model or nominal resistance model is generated remotely, such as via processing performed by a remote workstation or cloud server.

The operational dynamic model, operational resistance model or nominal resistance model may be generated/updated at any suitable frequency. For example, the operational dynamic model, operational resistance model or nominal resistance model may be generated/updated with each sample time-step or on any suitable hourly, daily, or monthly schedule.

Operational Resistance Model Module 170

In an example embodiment, SOH estimation system 100 comprises an operational resistance model module 170. Operational resistance model module 170, in an example embodiment, is configured to receive the updated operational resistance model from resistance model estimation module 175 and to store this model. In other words, the operational resistance model module 170 is simply the storage of the total resistance $R_T$ for each cell in the ESS. In an example embodiment, the total resistance $R_T$ can be implemented as a function of SOC using a look-up table. In this case, the operational resistance model module 170 is simply the storage of the look-up table for each cell in the ESS. In an example embodiment, operational resistance model module 170 is configured to provide the stored updated operational resistance model to the power rating estimation module 130.

Nominal Resistance Model Module 180

In an example embodiment, SOH estimation system 100 comprises a nominal resistance model module 180. Nominal resistance model module 180, in an example embodiment, is configured to receive an initial resistance model from resistance model estimation module 175 and to store these parameters. In other words, the nominal resistance model module can be configured to simply store the total resistance $R_T$ at beginning of life for each cell in the ESS. This total resistance may be re-estimated one or more times during the lifetime of the system. For example, this may be estimated at the time of manufacturing, during commissioning, or due to reconfiguration or maintenance performed on the ESS. In an example embodiment, nominal resistance model module 180 is configured to provide the stored updated nominal resistance model to the power rating estimation module 130.

Operational Dynamic Model Module 155

In an example embodiment, SOH estimation system 100 comprises an operational dynamic model module 155. Operational dynamic model module 155, in an example embodiment, is configured to receive the updated operational dynamic model from dynamic model estimation module 145 and to store these parameters. In other words, the operational dynamic model module may be configured to simply store the operational dynamic model ($R_0$, R1 and C1) for each cell in the ESS. In an example embodiment, operational dynamic model module 155 is configured to provide the stored updated operational dynamic model to the normalized capacity estimation module 120.

The updates to the operational resistance model in the operational resistance model module 170, and the operational dynamic model in the operational dynamic model module 155 can be done independently and at a different timescale than capacity estimation and/or power rating estimation. In one example embodiment, the timescale can be as small as under one minute, where real-time measurement data is used to update the model as quickly as possible. In another example embodiment, the timescale can be large, such as multiple days or months. This increased flexibility can allow model updates to be scheduled when sufficient information is present in the measured data to make an accurate update, improving the overall accuracy of SOH estimation as a result.

In an example embodiment, the signals or data discussed herein may be locally communicated between modules, all at the energy storage system (e.g., in the battery management system). But it is within the scope of this disclosure for one or more of the described modules to be located remote from the energy storage device (e.g., storing and processing data in a cloud server). In an example embodiment, the operational resistance model, nominal resistance model, and operational dynamic model may be updated based on information provided to dynamic model estimation module 145 and resistance model estimation module 175 (but this data may be provided to the three model modules from the cloud or other sources). And, in another example embodiment, the resistance model estimation module 175 and the dynamic model estimation module 145 may be located remote from the energy storage device, such as in the cloud. At its source, the measured data will be provided by sensors at the energy storage unit, but it is possible that this data could be first provided to a database or modules remote from the energy storage system. Moreover, the various modules described herein may be combined, their functions performed in whole or in part by other modules, and/or their functions may be distributed amongst these or other modules.

Normalized Capacity Estimation Module 120

In an example embodiment, the normalized capacity estimation module 120 is configured to receive a nominal capacity from nominal capacity module 140, receive voltage, current, and temperature measurements from sensors 150, receive a nominal OCV curve, $f_{ocv}$(SOC), from nominal OCV curve module 160, and receive an operational dynamic model, from the operational dynamic model module 155. The normalized capacity estimation module 120, in an example embodiment, is configured to determine the normalized capacity estimate, $NC_n$, based on the received information, and provide this to the SOH aggregation module 110.

In an example embodiment, the determination of the normalized capacity estimate, $NC_n$, may be made by using the values of the ohmic resistance ($R_{0,n}$), the polarization resistance ($R_{1,n}$) and the capacitance ($C_{1,n}$) stored in the operational dynamic model module, for each cell. In an example embodiment, the normalized capacity estimation module 120 first initializes (time k=0) values for the model circuit diagram with the polarization voltage for the RC pair of all cells initialized to: $V_{1,n}=0$, and the initial open circuit voltage for all cells initialized to $V_{ocv,n}=V_{m,n}$.

Normalized capacity estimation module 120 may next determine the polarization voltage of the RC pair and $n^{th}$ cell, for each cell, at time step k, based on the previously calculated polarization voltage, the coefficients for the ECM, and the previously measured current. For example:

$$V_{1,n,k} = \exp\left[-\frac{\Delta t}{\tau_{1,n}}\right]V_{1,n,k-1} + \left(1 - \exp\left[-\frac{\Delta t}{\tau_{1,n}}\right]\right)R_{1,n}I_{m,k-1}$$

Where $\tau_{1,n}=R_{1,n}*C_{1,n}$ and where $\Delta t$=the change in time between sampling step k and k−1. In this example, the polarization voltage for each cell at each time step is based on the polarization voltage at the previous time step and an update based on the measured current.

Next, in an example embodiment, the normalized capacity estimation module 120 is configured to predict the open circuit voltage, $V_{ocv,n,k}$, for the $n^{th}$ cell, for each cell, at time step k. This calculation is based on the present voltage measurement plus the polarization voltage plus the voltage drop due to the present current measurement passing through the resistance $R_0$ of the ECM. For example, $$V_{ocv,n,k}=V_{m,n,k}+V_{1,n,k}+I_m R_{0,n}$$

Next, in an example embodiment, the normalized capacity estimation module 120 is configured to gate when it calculates an estimate of capacity, so as to only do so when the energy storage system has experienced sufficient charging or discharging to make a reliable calculation. Although this can be done in various ways, consistent with this disclosure, in an example embodiment, this is performed by looking at the OCV over a time window from k to k+W, e.g., $V_{ocv,n,k}$ to $V_{ocv,n,k+W}$. The normalized capacity estimation module 120 may be configured to determine a minimum OCV ($V_{ocv,min}$) and maximum OCV ($V_{ocv,max}$) between $V_{ocv,n,k}$ and $V_{ocv,n,k+W}$. The time step at which these estimates occur are denoted $t_1$ and $t_2$. With these identified, the normalized capacity estimation module 120 may be configured to determine the OCV curve gradient at $V_{ocv,min}$ and $V_{ocv,max}$. These gradient values are denoted herein as $V_{dOcv,min}$ and $V_{dOcv,max}$.

In an example embodiment, the normalized capacity estimation module 120 is configured to calculate the capacity when conditions are appropriate to do so. Although other gating criteria may be used, in one example embodiment, the conditions are appropriate for calculating the capacity when:

$$V_{ocv,max}-V_{ocv,min}>\Delta_{Thres} \quad \text{i.}$$

$$V_{dOcv,min,k}>V_{Thres} \text{ and } V_{dOcv,max,k}>V_{Thres} \quad \text{ii.}$$

where $\Delta_{Thres}$ and $V_{Thres}$ are configurable thresholds. The purpose of this filter or these gating thresholds are to ensure that the calculation is made only when there is sufficient information in the data to get an accurate estimate of capacity. In this manner, through use of opportunistic monitoring of the energy storage device, the SOH can be calculated in an on-line mode.

In an example embodiment, if the above criteria is met, the normalized capacity estimation module 120 is configured to calculate an estimated capacity (for each cell n), $Q_{e,n}$, based on the OCV at two points and the charge accumulation in-between:

$$Q_{e,n} = \frac{\sum_{k=t_1}^{t_2} \frac{\eta I_{m,k} * \Delta t}{3600}}{g_{soc}(V_{ocv,n,max}) - g_{soc}(V_{ocv,n,min})}$$

where $g_{soc}$ is the inverse of open circuit voltage curve ($f_{ocv}^{-1}$), $\eta$ is the coulombic efficiency, and where the function $f_{ocv}$ is the open circuit voltage curve provided by nominal OCV curve module 160, and it is a function of the state-of-charge (SOC) for each cell n.

The capacity predictions, $Q_{e,n}$, can be filtered using an exponentially weighted moving average function to produce a filtered capacity estimate, $Q_{f,n}$, of the $n^{th}$ cell:

$$Q_{f,n,h}=(1-\lambda_Q)Q_{f,n,h-1}+\lambda_{cap}Q_{e,n}$$

where $\lambda_Q$ is the constant smoothing factor used in filtering capacity estimates, and where the index h represents the estimation index, which is at a different timescale than the sampling index k. In an example embodiment, $Q_{f,n}$ may have units of Ah.

Thus, in an example embodiment, the filtered capacity estimate is based on a minimum predicted OCV and a maximum predicted OCV that is filtered to prevent updates to the capacity estimate when (1) the difference between the maximum predicted OCV and the minimum predicted OCV is less than a threshold, when (2) a minimum predicted OCV curve gradient, $V_{dOcv,min}$ associated with the minimum predicted OCV is less than a gradient threshold, and when (3) a maximum predicted OCV curve gradient, $V_{dOcv,max}$, associated with the maximum predicted OCV is less than a gradient threshold.

In an example embodiment, the normalized capacity estimation module 120 may further be configured to estimate the normalized capacity, $NC_n$, for each cell. This may be done by dividing the filtered capacity estimate, $Q_{f,n}$, of the $n^{th}$ cell by the nominal capacity, $Q_{nom}$. For example:

$$NC_n = \frac{Q_{f,n}}{Q_{nom}}$$

In an example embodiment, the normalized capacity estimate $NC_n$, can be broken down into two smaller terms: normalized charge capacity estimate $NC_{c,n}$ and normalized discharge capacity estimate $NC_{d,n}$. Splitting the normalized capacity into charge and discharge components allows for the incorporation of cell imbalance when estimating SOH. The two terms can be calculated as follows:

$$NC_{c,n} = \frac{(1 - g_{soc}(V_{ocv,n,k})) * Q_{f,n,h}}{Q_{nom}}$$

-continued $$NC_{d,n} = \frac{g_{soc}(V_{ocv,n,k}) * Q_{f,n,h}}{Q_{nom}}$$

At a specific point in the operation of the energy storage system, the term $NC_{c,n}$ represents the total normalized charge that can be accepted by the cell while the term $NC_{d,n}$ represents the total normalized charge that can be removed from the cell. The $V_{ocv,n,k}$ can be taken at any time step k and used to both calculate $NC_{c,n}$ and $NC_{d,n}$. This time step k may be selected to correspond to $V_{ocv,n,max}$ or $V_{ocv,n,min}$. However, any suitable time step k may be selected within the estimation window. For each cell, the sum of $NC_{c,n}$ and $NC_{d,n}$ will be equal to $NC_n$. Therefore, normalized capacity $NC_n$ can be replaced by the combination of the normalized charge capacity $NC_{c,n}$ and the normalized discharge capacity $NC_{d,n}$ at any point in the present disclosure.

In an example embodiment, normalized capacity estimation module 120 is configured to provide the nominal capacity, NCR, to the SOH aggregation module 110.

In an example embodiment, one of the advantages of the disclosed state of health estimation system is that it decouples estimation of capacity from other model parameter estimation. This is in contrast to existing approaches where one or more model parameters may be estimated simultaneously with capacity at the same timescale. Joint estimation can lead to instability issues since there is often not enough information in the data to provide an accurate estimate of each parameter. The disclosed SOH estimation system 100 allows the parameter models to be estimated at a different timescale than capacity and only when sufficient measurement information is present, thereby providing a more stable and accurate estimate.

Another advantage of the disclosed SOH estimation techniques is the ability to estimate the operational resistance model and the operational dynamic model offline (testing) or on-line (monitoring), with the analysis performed locally at the energy storage system or remote from the energy storage system.

Another advantage of the disclosed SOH estimation technique is the ability to estimate capacity without requiring a full charge-discharge cycle. In an example embodiment, accurate capacity estimates can be determined during partial cycles by intelligently updating the capacity estimate when sufficient information is present in the measurement data rather than requiring a complete charge-discharge cycle from 100% SOC to 0% SOC.

In contrast to typical capacity estimation techniques that may ignore OCV swing as a variable, in an example embodiment, the SOH estimation system 100 is configured to estimate capacity using accumulated charge, OCV swing and OCV curve gradient. Ignoring OCV swing increases the chances of errors being introduced because a small OCV swing might not have enough information available in the data to properly estimate capacity. By incorporating both OCV swing and OCV curve gradient, a more intelligent and robust capacity estimate can be obtained.

Rated Discharge Current Module 190

In an example embodiment, SOH estimation system 100 further comprises a rated discharge current module 190. The rated discharge current module may be configured to provide a rated discharge current, $I_d$, to power rating estimation module 130. In an example embodiment, the rated discharge current may correspond to the designed nameplate discharge current (at whatever level SOH estimation system is being applied, e.g. cell, energy storage device, ESS, etc.). For example, the rated discharge current may be based on a design (or 'nameplate') rating for the cell(s). However, the rated discharge current may be based on one or more other designed physical limitations of the energy storage device or the energy storage system (e.g., the bus bar, the BMS limits, overcurrent protection devices, etc.) Therefore, different ESSs will have different rated discharge currents based on their specific design and application. In an example embodiment, the most limiting factor may dominate the rated discharge current.

Power Rating Estimation Module 130

In an example embodiment, the SOH estimation system 100 further comprises a power rating estimation module 130. In an example embodiment, power rating estimation module 130 is configured to receive the operational resistance model $R_{T,op}$ for each cell in the energy storage device. Power rating estimation module 130 may receive the operational resistance model from operational resistance model module 170. In an example embodiment, power rating estimation module 130 is configured to receive the nominal OCV curve, $f_{ocv}$(SOC). Power rating estimation module 130 may receive the nominal OCV curve from nominal OCV curve module 160. In an example embodiment, power rating estimation module 130 is configured to receive a nominal resistance model, $R_{T,nom}$ for each cell in the stack. Power rating estimation module 130 may receive the nominal resistance model from nominal resistance model module 180. In an example embodiment, power rating estimation module 130 is configured to receive a rated discharge current of the energy storage system, $I_d$. Power rating estimation module 130 may receive the rated discharge current from rated discharge current module 190.

Furthermore, in an example embodiment, power rating estimation module 130 is configured to generate a power rating estimaten, $PR_n$, based on the received operational resistance model, nominal OCV curve, nominal resistance model, and rated discharge current. In one example embodiment, this is done by the following steps. First, the SOC region can be split into a total of B equally-sized segments between 0 and 100%. The mid-point of these segments are represented by $SOC_b$, where b comprises sequential integers between 1 and B. For example, where B=10, $SOC_1$=5, $SOC_2$=15, ... $SOC_{10}$=95).

Next, the power rating estimation module 130 is configured to determine a time-weighted average of discharge power by summing B individual power segments across the full SOC operating range $$PR_{e,n} = \frac{1}{B}\sum_{b=1}^{B} \frac{f_{ocv}(SOC_b) - I_d * R_{T,op,n}(SOC_b)}{f_{ocv}(SOC_b) - I_d * R_{T,nom,n}(SOC_b)}$$

where $f_{ocv}$ is a function representing the OCV value at specified states of charge and the value of $R_{T,op,n}$ and $R_{T,nom,n}$ are each calculated based on an $R_T$ vs. SOC look-up table. In an example embodiment, for each SOC segment b=1 to B, the power rating estimation module 130 calculates a numerator representing the OCV reduced by the operational resistance (or stated another way, a numerator representing an OCV reduced by the voltage drop due to the operational resistance.) In an example embodiment, for each SOC segment b=1 to B, the power rating estimation module 130 also calculates a denominator representing the OCV reduced by the nominal resistance (or stated another way, denominator representing an OCV reduced by the voltage drop due to the nominal resistance.) In an example embodiment, the numerator is divided by this denominator to provide a power rating at that SOC. The power rating estimation module 130 is further configured to average the individual power ratings by summing these and dividing by B to form a power rating prediction $PR_{e,n}$.

Next, the power rating estimation module 130 may be configured to filter the power rating predictions using an exponentially weighted moving average function to produce a power rating estimate:

$$PR_{n,h} = (1-\lambda_{pr})PR_{n,h-1} + \lambda_{pr}PR_{e,n}$$

where $\lambda_{pr}$ is a constant smoothing factor used in filtering power rating predictions. In an example embodiment, the range for the value of $\lambda_{pr}$ can be from 0.01-0.1, although any suitable range may be used. This smoothing factor is configured to give more weight to the previous calculated power rating value than the current one. The filter provides a weighting to a previous $PR_n$, determined at a time h–1, where h is the current sample and h–1 is the previous sample, to the current $PR_{e,n}$.

In this manner, the power rating estimation module 130 is configured to generate the power rating estimate, $PR_n$, for the nth cell in the energy storage device. The power rating estimation module 130, in an example embodiment, is configured to provide the $PR_n$ to the SOH aggregation module 110. Thus, in an example embodiment, determining a power rating estimate, $PR_n$, based on the rated discharge current allows high power applications to naturally factor in the effects of cell resistance more heavily than low power applications. In another example embodiment, the power rating estimate, $PR_n$, may be based on multiple current values, generating multiple SOH values. It also accurately accounts for the change in power across the OCV curve as voltage changes during discharge. It may also incorporate both ohmic and polarization internal resistance components for more accurate steady-state power estimation.

Another advantage of the disclosed SOH estimation technique is the flexibility of the method to predict SOH over a range of temperatures and/or at the present temperature. This allows SOH to factor in real-world performance limiters such as cold temperature and thus more closely predict the actual energy that can be delivered from a battery during operation.

Method

Figure 4:
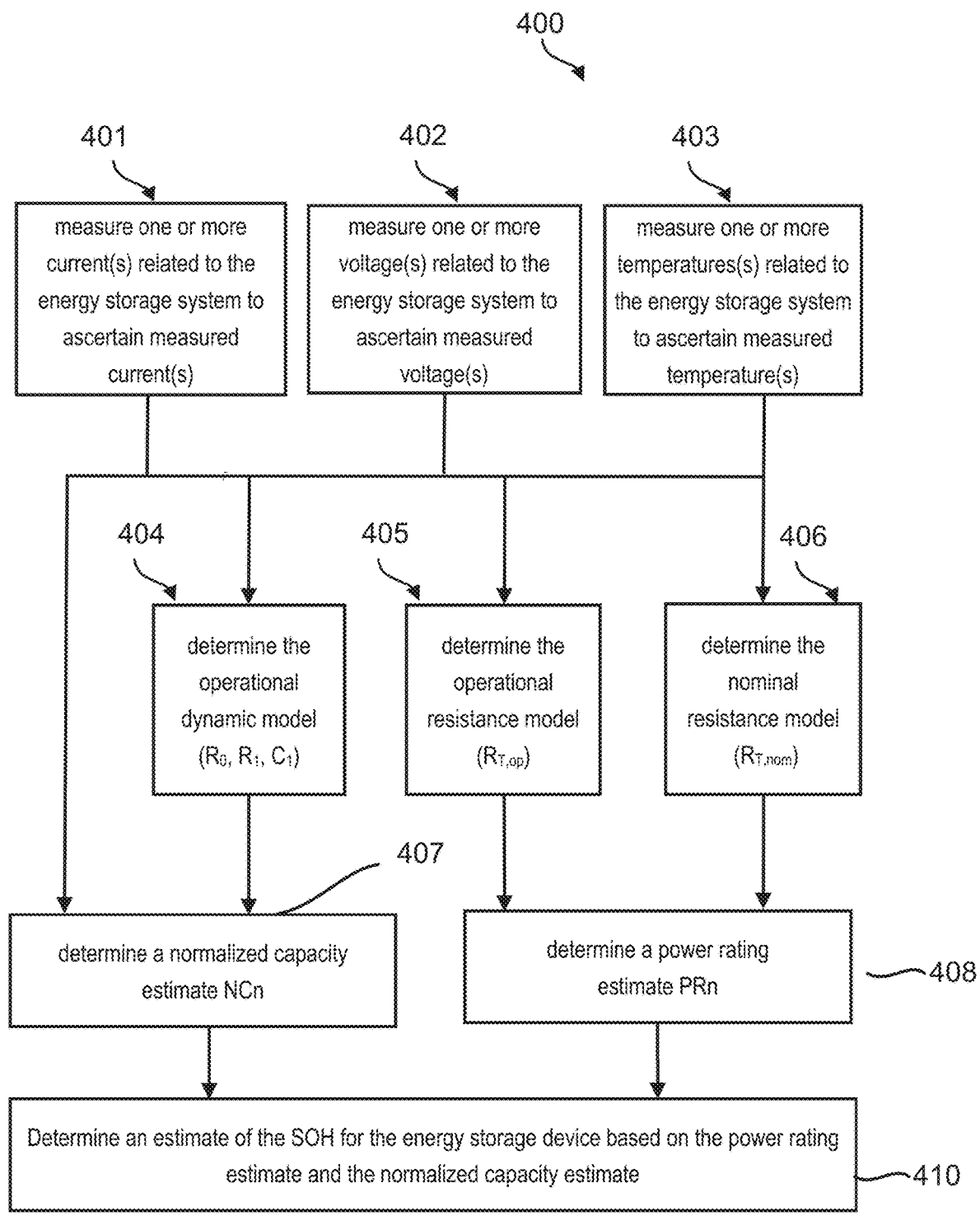
FIG. 4 is a flow diagram illustrating an example method.

FIG. 4 is a flow diagram illustrating an example method 400 of estimating the state-of-health of an energy storage device. The example method includes measuring one or more current(s) related to the energy storage system to ascertain a measured current(s) (401). For example, a sensor 150 may measure a current related to the energy storage system to ascertain a measured current. (See, for example, current $I_M$, $I_{M,1 \ldots N}$.) The current may be measured using a current measurement circuit.

In accordance with various example embodiments, the method may further comprise measuring one or more voltage(s) related to the energy storage system to ascertain measured voltage(s) (402). (See, for example, voltage measurement $V_M$, $V_{M,1 \ldots N}$.) The voltage may be measured using a voltage measurement circuit. Moreover, method 400 may further comprise measuring one or more temperature(s) related to the energy storage system to ascertain measured temperature(s) (403).

In an example embodiment, the method further comprises determining, at the dynamic model estimation module 145, the operational dynamic model for each cell, of the N cells of the energy storage device, based on the voltage input V, the current input I, and/or the temperature input T (404).

In an example embodiment, the method further comprises determining, at the resistance model estimation module 175, the operational resistance model for each cell, of the N cells of the energy storage device, based on the voltage input V, the current input I, and/or the temperature input T (405).

In an example embodiment, the method further comprises determining, at the resistance model estimation module 175, the nominal resistance model for each cell, of the N cells of the energy storage device, based on the voltage input V, the current input I, and/or the temperature input T (406).

In an example embodiment, estimation of the operational dynamic model, the operational resistance model and the nominal resistance model may be done on three independent timescales.

In an example embodiment, the method further comprises determining, at the normalized capacity estimation module 120, the normalized capacity estimate (406) for each cell, of the N cells of the energy storage device, based on the nominal capacity input, the voltage input V, the current input I, the temperature input T, the nominal OCV, and the operational dynamic model.

In an example embodiment, the method further comprises determining, at the power rating estimation module, the power rating estimate (408) for each cell, of the N cells of the energy storage device, based on the operational resistance model, the nominal OCV, the nominal resistance model, and the rated discharge current.

In an example embodiment, the method further comprises determining, at a SOH aggregation module, an estimate of the operational SOH for the energy storage device based on the power rating estimate and the normalized capacity estimate (410).

Example embodiments of the systems, methods, and devices described herein may be implemented in hardware, software, firmware, or some combination of hardware, software, and firmware. For example, the block diagram and a module or combinations of modules of FIG. 2A and the method of FIG. 4 may be implemented in hardware, software, firmware, or some combination of hardware, software, and firmware. For example, the method of FIG. 4 may be implemented in the cloud. The firmware or software modules may be implemented within a single device or distributed among multiple devices at different locations communicating over a suitable wired or wireless network. For example, the SOH aggregation module 110, normalized capacity estimation module 120 and/or power rating estimation module 130 of FIG. 2A may be implemented in hardware, software, firmware, or some combination of hardware, software, and firmware.

In accordance with various example embodiments, the systems, methods and devices of the present disclosure are applicable at the cell level, at the device level, at the ESS level, and in the context of a single cell, a single module, a stack of cells, a stack of modules, and/or a bank. With reference now to FIG. 2A, briefly by way of example, in the context of a single cell SOH estimate, a module SOH estimate, a stack SOH estimate and bank SOH estimate, the following inputs: voltage measurements ($V_{m,1 \ldots N}$), temperature measurements ($T_{m,1 \ldots N}$), nominal capacity ($Q_{nom}$), nominal OCV curve ($f_{ocv}$), nominal resistance model ($R_{T,nom}$), operational resistance model ($R_{T,op}$), current measurement ($I_m$), operational dynamic model ($R_0$, $R_1$ and $C_1$), and rated discharge current ($I_d$) can be used to produce the normalized capacity ($NC_{n, 1 \ldots N}$) and power rating ($PR_{n, 1 \ldots N}$) estimates. The normalized capacity ($NC_{n, 1 \ldots N}$) and power rating ($PR_{n, 1 \ldots N}$) estimates in turn can be used to generate a SOH estimate.

Figure 2B:
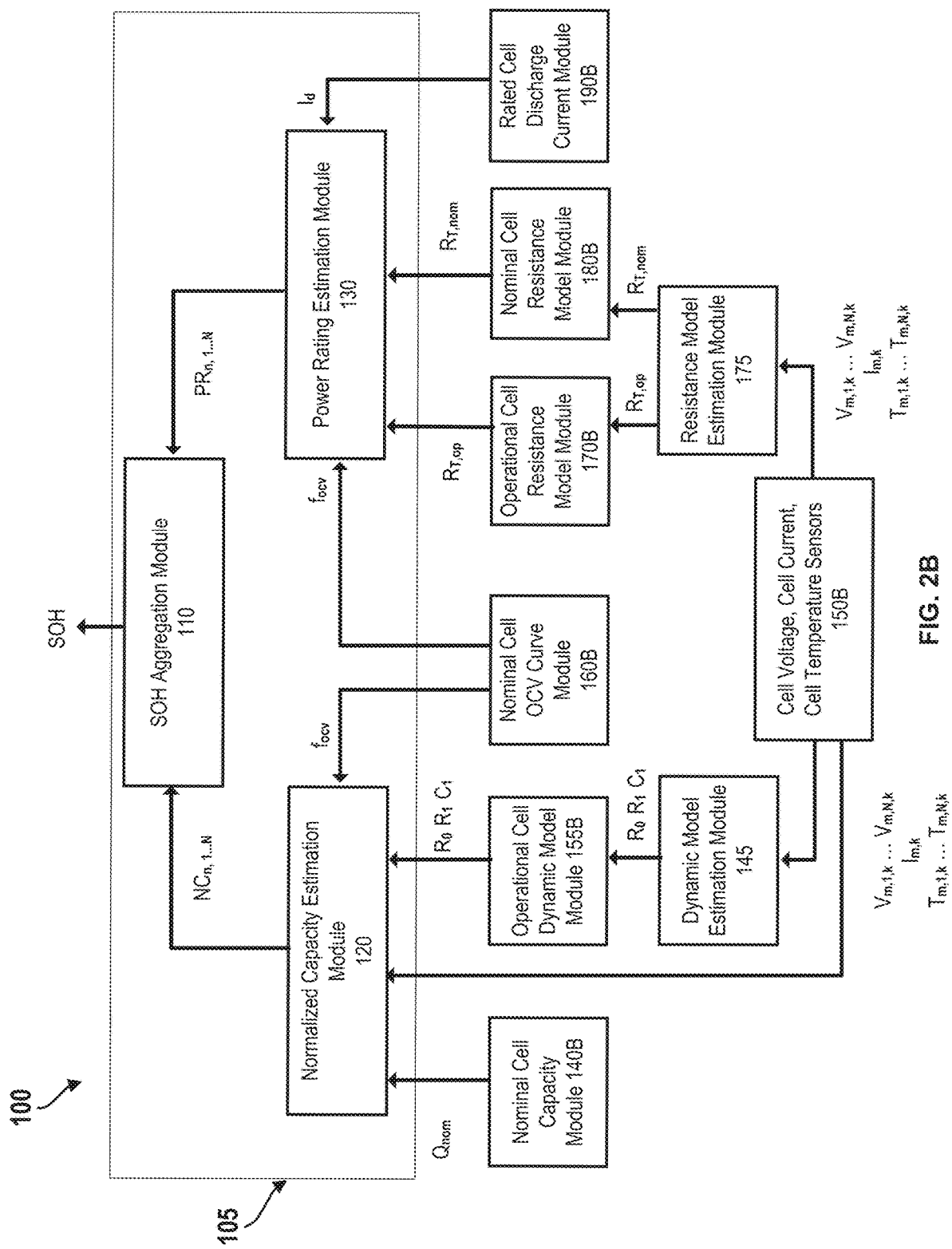

With reference now to FIG. 2B, in one example embodiment, n represents a single cell and the energy storage device can have N cells. In this example embodiment, as illustrated in FIG. 2B, it is cell voltage, cell current, and cell temperature that are inputs, and the nominal capacity, operational resistance model, nominal resistance model, operational dynamic model, rated discharge current and nominal OCV curve represent the cells of the energy storage device. For clarity, the schematic blocks 140, 150, 155, 160, 170, 180, and 190 of FIG. 2A have been designated as 140B, 150B, 155B, 160B, 170B, 180B, and 190B to reflect the 'cell' focus in FIG. 2B that is otherwise functionally similar to FIG. 2A.

Figure 2C:
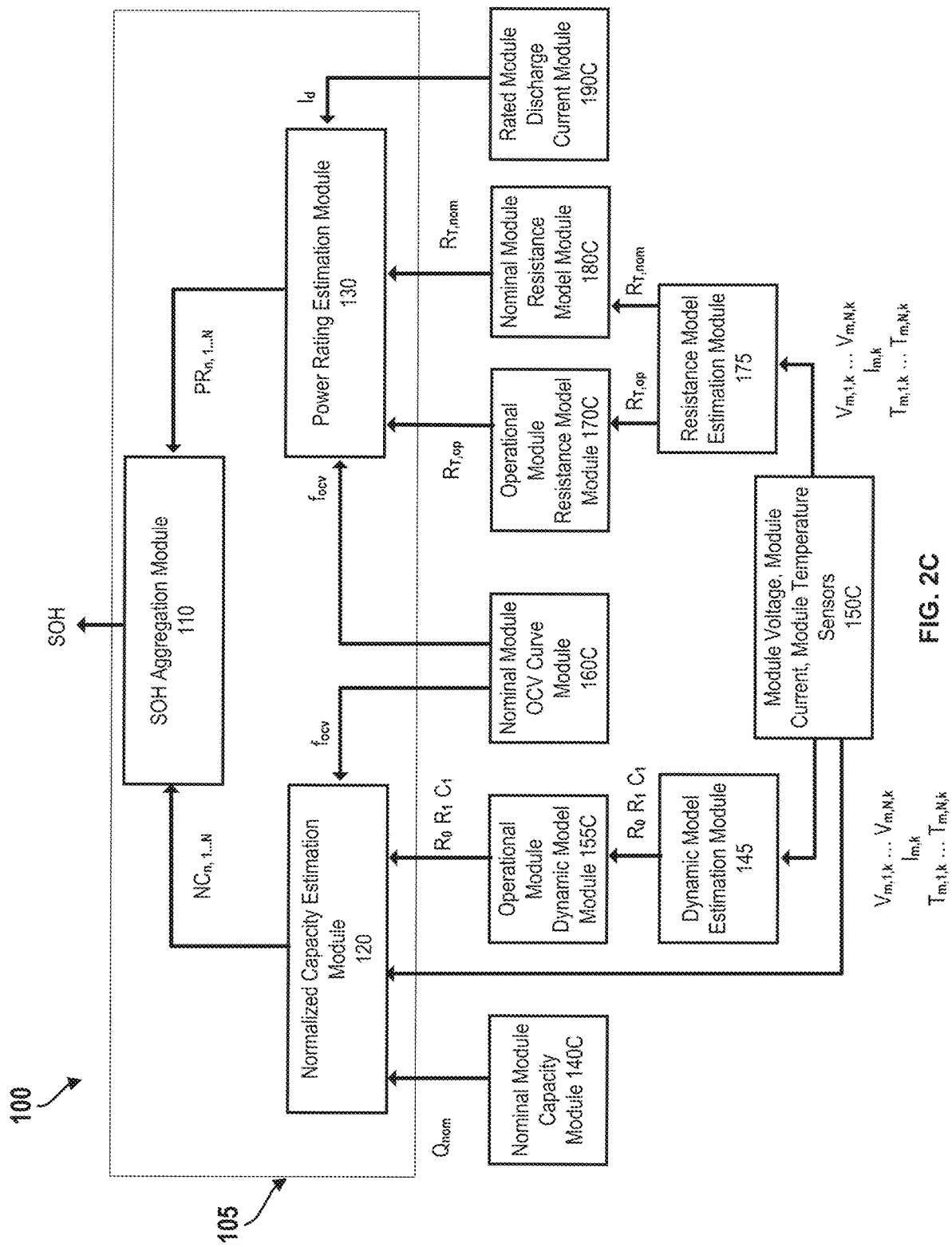

With reference now to FIG. 2C, in another example embodiment, n represents a single module and the energy storage device has N modules. In this example embodiment, as illustrated in FIG. 2C, it is module voltage, module current, and module temperature that are the inputs, and the nominal capacity, operational resistance model, nominal resistance model, operational dynamic model, rated discharge current and nominal OCV curve represent the modules of the energy storage device instead of the cells. For clarity, the schematic blocks 140, 150, 155, 160, 170, 180, and 190 of FIG. 2A have been designated as 140C, 150C, 155C, 160C, 170C, 180C, and 190C to reflect the 'module' focus in FIG. 2C that is otherwise functionally similar to FIG. 2A.

Figure 2D:
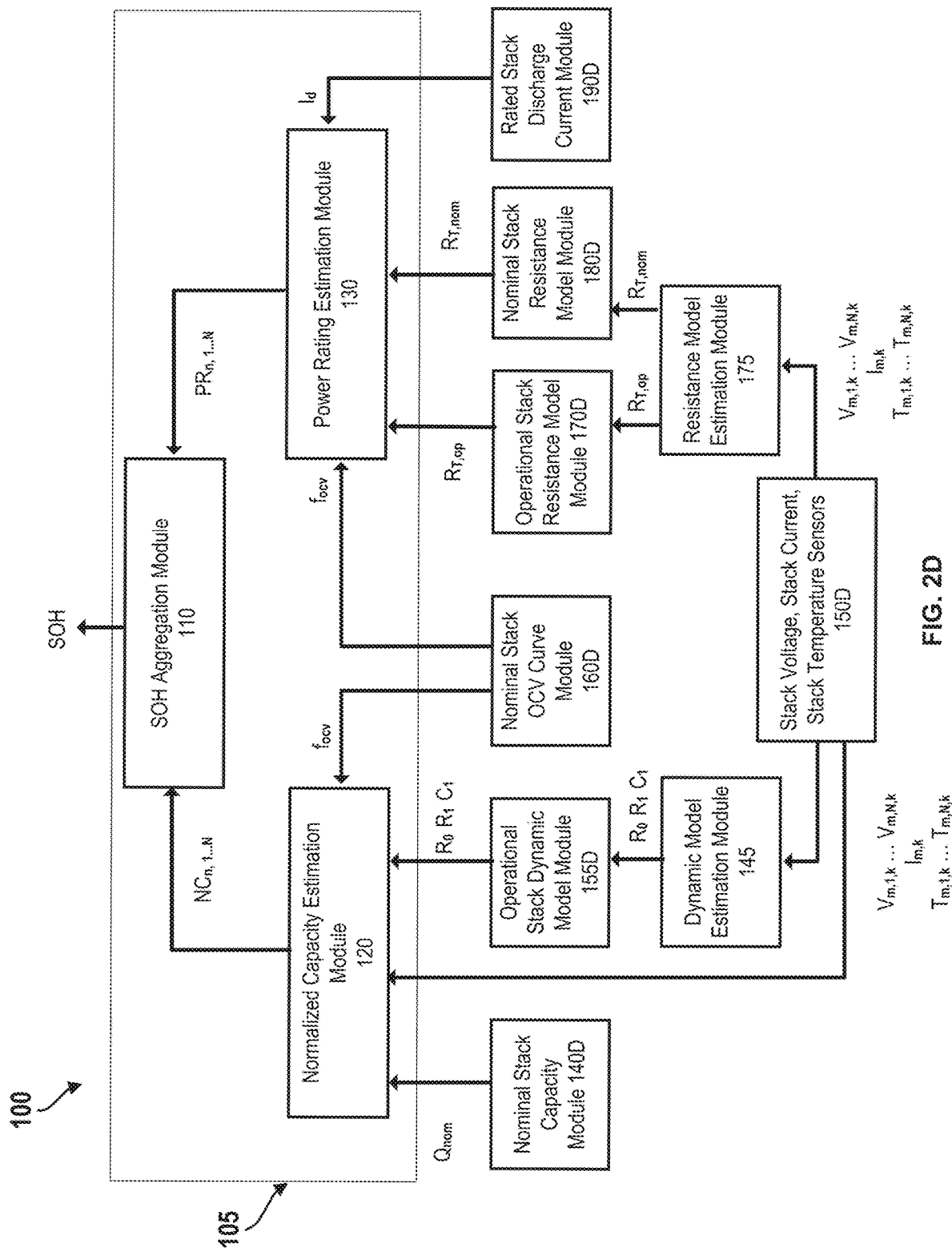

With reference now to FIG. 2D, in another example embodiment, n represents a single stack and the energy storage device can have N stacks. In this example embodiment, as illustrated in FIG. 2D, it is stack voltage, stack current, and stack temperature that are the inputs, and the nominal capacity, operational resistance model, nominal resistance model, operational dynamic model, rated discharge current and nominal OCV curve represent the stacks of the energy storage device instead of the cells. For clarity, the schematic blocks 140, 150, 155, 160, 170, 180, and 190 of FIG. 2A have been designated as 140D, 150D, 155D, 160D, 170D, 180D, and 190D to reflect the 'stack' focus in FIG. 2D that is otherwise functionally similar to FIG. 2A.

In an example embodiment, the SOH estimation system may be used in the context of stationary energy storage applications, for generating a SOH estimate for the ESS. In another example embodiment, the SOH estimation system may be used in the context of second-life applications for batteries. For example, a battery pack in a vehicle may no longer be able to meet the vehicle energy requirements, but may provide sufficient energy capacity and power for an alternative function such as stationary energy storage applications. In another example embodiment, the SOH estimation system may be used in the context of an electric vehicle (e.g. passenger vehicle, delivery vehicle, autonomous vehicle, and/or the like). In another example embodiment, the SOH estimation system may be used in the context of specialty vehicles such as an electric forklift or golf carts. In another example embodiment, the SOH estimation system may be used in the context of trains or long haul trucking (e.g. where a fuel cell or other energy source charges an energy storage device on the train or truck). In another example embodiment, the SOH estimation system may be used in the context of airplanes. In another example embodiment, the SOH estimation system may be used in the context of a test fixture (such as in a lab) to estimate SOH for one or more energy storage devices within a more controlled environment.

In the present disclosure, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes, and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including, for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in the numerical range are individual values such as 2, 3 and 4 and sub-ranges such as 1-3, 2-4 and 3-5, etc. The same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative of the example embodiments and their best mode and are not intended to otherwise limit the scope of the present disclosure in any way. Furthermore, the connecting lines shown in the various figures contained herein are intended to represent exemplary functional relationships and/or physical couplings between the various elements. It should be noted that many alternative or additional functional relationships or physical connections may be present in a practical device.

As one skilled in the art will appreciate, the mechanism of the present disclosure may be suitably configured in any of several ways. It should be understood that the mechanism described herein with reference to the figures is but one exemplary embodiment of the disclosure and is not intended to limit the scope of the disclosure as described above.

It should be understood, however, that the detailed description and specific examples, while indicating exemplary embodiments of the present disclosure, are given for purposes of illustration only and not of limitation. Many changes and modifications within the scope of the instant disclosure may be made without departing from the spirit thereof, and the disclosure includes all such modifications. The corresponding structures, materials, acts, and equivalents of all elements in the claims below are intended to include any structure, material, or acts for performing the functions in combination with other claimed elements as specifically claimed. The scope of the disclosure should be determined by the appended claims and their legal equivalents, rather than by the examples given above. For example, the operations recited in any method claims may be executed in any order and are not limited to the order presented in the claims. Moreover, no element is essential to the practice of the disclosure unless specifically described herein as "critical" or "essential."

What is claimed is:

1. A state of health (SOH) estimation system for determining an estimate of the SOH for an energy storage device that accounts for both power fade and capacity fade, the SOH estimation system comprising:
    a SOH estimation module configured to receive, and to determine an estimate of the SOH of the energy storage device based on:
        a nominal capacity input representing a nominal capacity of the energy storage device;
        a voltage input, V, representing a measured voltage associated with the energy storage device;
        a current input, I, representing a measured current from/to the energy storage device;
        a nominal open circuit voltage (OCV) curve associated with the energy storage device;
        an operational resistance model associated with the energy storage device;
        a nominal resistance model associated with the energy storage device;
        an operational dynamic model associated with the energy storage device, wherein the operational dynamic model comprises model parameters based on the current input associated with the energy storage device; and
        a rated discharge current associated with the energy storage device, wherein the rated discharge current is associated with the power fade.

2. The SOH estimation system of claim 1, wherein the SOH estimation module is further configured to receive, and to further determine the estimate of the SOH of the energy storage device based on a temperature input representing a temperature associated with the energy storage device.

3. A state of health (SOH) estimation system for determining an estimate of the SOH for an energy storage device that accounts for both power fade and capacity fade, the SOH estimation system comprising:
    a SOH estimation module configured to receive, and to determine an estimate of the SOH of the energy storage device based on:
    a nominal capacity input representing a nominal capacity of the energy storage device;
    a voltage input, V, representing a measured voltage associated with the energy storage device;
    a current input, I, representing a measured current from/to the energy storage device;
    a nominal open circuit voltage (OCV) curve associated with the energy storage device;
    an operational resistance model associated with the energy storage device;
    a nominal resistance model associated with the energy storage device;
    an operational dynamic model associated with the energy storage device; and
    a rated discharge current associated with the energy storage device;
    wherein the SOH estimation module further comprises a SOH aggregation module configured to receive N power rating estimates, $PR_n$, from the energy storage device, and N normalized capacity estimates, $NC_n$, from the energy storage device, and to determine the estimate of the SOH for the energy storage device based on the power rating estimates, $PR_n$, and a normalized capacity estimates, $NC_n$, wherein the estimate of the SOH for the energy storage device is an aggregate estimate for the energy storage device.

4. A state of health (SOH) estimation system for determining an estimate of the SOH for an energy storage device that accounts for both power fade and capacity fade, the SOH estimation system comprising:
    a SOH estimation module configured to receive, and to determine an estimate of the SOH of the energy storage device based on:
    a nominal capacity input representing a nominal capacity of the energy storage device;
    a voltage input, V, representing a measured voltage associated with the energy storage device;
    a current input, I, representing a measured current from/to the energy storage device;
    a nominal open circuit voltage (OCV) curve associated with the energy storage device;
    an operational resistance model associated with the energy storage device;
    a nominal resistance model associated with the energy storage device;
    an operational dynamic model associated with the energy storage device; and
    a rated discharge current associated with the energy storage device;
    wherein the SOH estimation module further comprises a SOH aggregation module configured to receive a power rating estimation, $PR_n$, for each of n cells in the energy storage device, and a normalized capacity estimate, $NC_n$, for each of n cells in the energy storage device, and to determine the estimate of the SOH for the energy storage device based on the power rating estimation, $PR_n$, and the normalized capacity estimate, $NC_n$, wherein the estimate of the SOH for the energy storage device is an aggregate estimate for the energy storage device, wherein the energy storage device comprises N cells.

5. The SOH estimation system of claim 4, wherein the SOH estimation module further comprises a normalized capacity estimation module configured to determine the normalized capacity estimate, $NC_n$, for each cell, of the N cells of the energy storage device, based on the nominal capacity input, the voltage input V, the current input I, a temperature input T, the nominal OCV, and the operational dynamic model.

6. The SOH estimation system of claim 4, wherein the SOH estimation module further comprises a power rating estimation module configured to determine the power rating estimation, $PR_n$, for each cell, of the N cells of the energy storage device, based on the operational resistance model, the nominal OCV, the nominal resistance model, and the rated discharge current.

7. A method of determining an estimate of a state of health (SOH) for an energy storage device that accounts for both power fade and capacity fade, the method comprising:
receiving, at a SOH estimation module, the following information (received information):
a nominal capacity input representing a nominal capacity of the energy storage device;
a voltage input V representing a measured voltage associated with the energy storage device;
a current input I representing a measured current from/to the energy storage device;
a nominal open circuit voltage OCV curve associated with the energy storage device;
an operational resistance model associated with the energy storage device;
a nominal resistance model associated with the energy storage device;
an operational dynamic model associated with the energy storage device, wherein the operational dynamic model comprises model parameters based on current input associated with the energy storage device; and
a rated discharge current associated with the energy storage device, wherein the rated discharge current is associated with the power fade; and
determining, at the SOH estimation module, the estimate of the SOH for the energy storage device based on all of the received information.

8. The method of claim 7, further comprising receiving, at the SOH estimation module, the following additional received information: a temperature input T representing a temperature associated with the energy storage device.

9. The method of claim 7, wherein the SOH estimation module further comprises a SOH aggregation module, the method further comprising:
receiving, at the SOH aggregation module, a power rating estimate and a normalized capacity estimate; and
determining the estimate of the SOH for the energy storage device based on the power rating estimate and the normalized capacity estimate.

10. A method of determining an estimate of a state of health (SOH) for an energy storage device that accounts for both power fade and capacity fade, the method comprising:
receiving, at a SOH estimation module, the following information (received information):
a nominal capacity input representing a nominal capacity of the energy storage device;
a voltage input V representing a measured voltage associated with the energy storage device;
a current input I representing a measured current from/to the energy storage device;
a nominal open circuit voltage OCV curve associated with the energy storage device;
an operational resistance model associated with the energy storage device;
a nominal resistance model associated with the energy storage device;
an operational dynamic model associated with the energy storage device; and
a rated discharge current associated with the energy storage device; and
determining, at the SOH estimation module, the estimate of the SOH for the energy storage device based on all of the received information, wherein the SOH estimation module further comprises a SOH aggregation module;
receiving, at the SOH aggregation module, a power rating estimation estimate and a normalized capacity estimate; and
determining the estimate of the SOH for the energy storage device based on the power rating estimate and the normalized capacity estimate,
wherein the estimate of the SOH for the energy storage device is an aggregate estimate for the energy storage device, wherein the energy storage device comprises N cells.

11. A method of determining an estimate of a state of health (SOH) for an energy storage device that accounts for both power fade and capacity fade, the method comprising:
receiving, at a SOH estimation module, the following information (received information):
a nominal capacity input representing a nominal capacity of the energy storage device;
a voltage input V representing a measured voltage associated with the energy storage device;
a current input I representing a measured current from/to the energy storage device;
a nominal open circuit voltage OCV curve associated with the energy storage device;
an operational resistance model associated with the energy storage device;
a nominal resistance model associated with the energy storage device;
an operational dynamic model associated with the energy storage device; and
a rated discharge current associated with the energy storage device; and
determining, at the SOH estimation module, the estimate of the SOH for the energy storage device based on all of the received information;
wherein the SOH estimation module further comprises a normalized capacity estimation module, the method further comprising determining, at the normalized capacity estimation module, a normalized capacity estimate for each cell, of N cells of the energy storage device, based on the nominal capacity input, the voltage input V, the current input I, the nominal OCV, and the operational dynamic model.

12. A method of determining an estimate of a state of health (SOH) for an energy storage device that accounts for both power fade and capacity fade, the method comprising:
receiving, at a SOH estimation module, the following information (received information):
a nominal capacity input representing a nominal capacity of the energy storage device;
a voltage input V representing a measured voltage associated with the energy storage device;
a current input I representing a measured current from/to the energy storage device;
a nominal open circuit voltage OCV curve associated with the energy storage device;
an operational resistance model associated with the energy storage device;
a nominal resistance model associated with the energy storage device;
an operational dynamic model associated with the energy storage device; and
a rated discharge current associated with the energy storage device; and
determining, at the SOH estimation module, the estimate of the SOH for the energy storage device based on all of the received information;

wherein the SOH estimation module further comprises a power rating estimation module, the method further comprising determining, at the power rating estimation module, a power rating estimation for each cell, of N cells of the energy storage device, based on the operational resistance model, the nominal OCV, the nominal resistance model, and the rated discharge current.

* * * * *